United States Patent
Kaushik

(10) Patent No.: US 7,820,538 B2
(45) Date of Patent: Oct. 26, 2010

(54) METHOD OF FABRICATING A MOS DEVICE WITH NON-SIO$_2$ GATE DIELECTRIC

(75) Inventor: Vidya Kaushik, Hoeilaart (BE)

(73) Assignee: Freescale Semiconductor, Inc., Austin, TX (US)

( * ) Notice: Subject to any disclaimer, the term of this patent is extended or adjusted under 35 U.S.C. 154(b) by 184 days.

(21) Appl. No.: 11/911,931

(22) PCT Filed: Apr. 21, 2005

(86) PCT No.: PCT/EP2005/051784

§ 371 (c)(1),
(2), (4) Date: Oct. 18, 2007

(87) PCT Pub. No.: WO2006/111203

PCT Pub. Date: Oct. 26, 2006

(65) Prior Publication Data

US 2008/0194092 A1      Aug. 14, 2008

(51) Int. Cl.
    *H01L 21/3205*   (2006.01)
(52) U.S. Cl. .................................................. 438/591
(58) Field of Classification Search .................. None
    See application file for complete search history.

(56) References Cited

U.S. PATENT DOCUMENTS

| | | | |
|---|---|---|---|
| 5,382,533 A | 1/1995 | Ahmad et al. | |
| 5,712,208 A | 1/1998 | Tseng et al. | |
| 6,287,897 B1 | 9/2001 | Gousev et al. | |
| 7,355,235 B2 * | 4/2008 | Wang et al. | 257/310 |
| 2006/0237803 A1 * | 10/2006 | Zhu et al. | 257/410 |

OTHER PUBLICATIONS

"80 nm Poly-Si Gate CMOS with HfO2 Gate Dielectric", authored by C. Hobbs, H. Tseng, K Reid. B Taylor, L Dip, L Hebert, R Garcia, R Hegde, J. Grant, D. Gilmer, A Franke, V. Dhandapani, M.Azrak, LPrabhu, R. Rai, S. Bagchi, J. Conner, S, Backer, F. Dumbuya, B. Nguyen and P Tobin, pp. 30.1.1-30.1.2. Electron Devices Meeting, 2001, IEDM Technical Dig.*

"Fermi-Level Pinning at Polysilicon/Metal Oxide Interface", Christopher C Hobbs, authored by Christopher Hobbs, Leonard R. C. Fonseca, Andrey Knizhnik, Veerarghavan Dhandapani; IEEE Transactionson Elecctron Devices, vol. 51, No. 6, Jun. 2004.*

Investigation of HFO2 dielectric stacks deposited by ALD with a mercury probe, X. Garros, C. Leroux, D. Blin, J.F. Damlencourt, A. M. Papon; ESSDERC 2002.*

(Continued)

*Primary Examiner*—Charles D Garber
*Assistant Examiner*—Andre' C Stevenson

(57) ABSTRACT

A polycrystalline silicon layer is deposited on a gate dielectric and then a portion thereof is re-oxidized so as to form a thin layer of oxide between the poly-Si layer and the underlying gate dielectric. Subsequently, the poly-Si layer is converted to a fully-silicided form so as to produce a FUSI gate. The gate dielectric can be a high-k material, for example a Hf-containing material, or SION, or another non-SiO$_2$ dielectric. The barrier oxide layer is preferably less than 1 nm thick.

20 Claims, 4 Drawing Sheets

OTHER PUBLICATIONS 80 nm poly-Si gate CMOS with HfO2 gate dielectric Hobbs, C.; Tseng, H.; Reid, K.; Taylor, B.; Dip, L.; Hebert, L.; Garcia, R.; Hegde, R.; Grant, J.; Gilmer, D.; Franke, A.; Dhandapani, V.; Azrak, M.; Prabhu, L.; Rai, R.; Bagchi, S.; Conner, J.; Backer, S.; Dumbuya, F.; Nguyen, B.; Tobin, P.; Electron Devices Meeting, 2001. IEDM Technical Digest. International Dec. 2-5, 2001 pp. 30.1.1-30.1.4.

Investigation of poly-Si/HfO/sub 2/ gate stacks in a self-aligned 70nm MOS process flow Kubicek, S.; Chen, J.; Ragnarsson, L.-A.; Carter, R.J.; Kaushik, V.; Lujan, G.S.; Cartier, E.; Henson, W.K.; Kerber, A.; Pantisano, L.; Beckx, S.; Jaenen, P.; Boullart, W.; Caymax, M.; DeGendt, S.; Heyns, M.; De Meyer, K.; European Solid-State Device Research, 2003. ESSDERC '03. 33rd Conference on Sep. 16-18, 2003 pp. 251-254.

Sub-quarter micron Si-gate CMOS with ZrO2 gate dielectric Hobbs, C.; Dip, L.; Reid, K.; Gilmer, D.; Hegde, R.; Ma, T.; Taylor, B.; Cheng, B.; Samavedam, S.; Tseng, H.; Weddington, D.; Huang, F.; Farber, D.; Schippers, M.; Rendon, M.; Prabhu, L.; Rai, R.; Bagchi, S.; Conner, J.; Backer, S.; Dumbuya, F.; Locke, J.; Workman, D.; Tobin, P.; VLSI Technology, Systems, and Applications, 2001. Proceedings of Technical Papers. 2001 International Symposium on Apr. 18-20, 2001 pp. 204-207.

Electrical properties of SIN/HF02/SION Gate Stacks with high Thermal Stability Morisaki, Y.; IEICE Transactions on Electronics, Tokyo, Japan Jan. 2004, pp. 37-43.

\* cited by examiner

METHOD OF FABRICATING A MOS DEVICE WITH NON-SIO₂ GATE DIELECTRIC

The present invention relates to the field of integrated circuit device manufacture. More particularly, the present invention relates to the manufacture of metal-oxide-silicon (MOS) devices and the like, notably such devices employing high dielectric constant (high-k) gate dielectric or, more generally, non-SiO$_2$ gate dielectric, that is, gate dielectric materials which do not behave as classic SiO$_2$ dielectric does, even if based on SiO$_2$ (thus including doped SiO$_2$ dielectrics).

The continuing drive for greater scaling of integrated circuit devices has lead to a desire to replace the SiO$_2$ that is traditionally used as gate dielectric in MOS devices. The Semiconductor Industry Association's (SIA's) International Technology Roadmap for Semiconductors (ITRS) 2004 specifies that MOSFET devices used in CMOS will require a gate-oxide equivalent thickness (EOT) less than 1.4 or 1.5 nm when these devices are scaled so as to have gate lengths below 65 nm, dropping to 0.8 nm or less by 2010. This would be very hard, if not impossible, to achieve using SiO$_2$ gate dielectric because it would require the use of a SiO$_2$ gate dielectric layer only a few atoms thick. Moreover, because of quantum mechanical direct tunneling, leakage current increases as the thickness of the SiO$_2$ gate dielectric decreases.

Accordingly, high-k dielectric materials have been attracting attention for use as gate dielectric materials, notably in applications where low gate leakage current is desired. High-k dielectric materials are those having a dielectric constant, k greater than that of silicon nitride, i.e. k>7. Some high-k dielectric materials under consideration include oxides and silicates of metals such as tantalum (Ta), zirconium (Zr) and hafnium (Hf). A number of existing proposals involve use of gate dielectric materials containing Hf, notably, HfO$_2$, HfO$_2$/SiN, HfSiON and HfAlO.

Difficulties arise when it is desired to use high-k dielectric materials, instead of SiO$_2$, as gate dielectric. In particular, SiO$_2$ is compatible both with the Si substrate and with existing fabrication processes. In order to be able to use a high-k dielectric material, or indeed other non-SiO$_2$ dielectric materials, as the gate dielectric, it is necessary to overcome potential problems due to chemical bonding effects and difficulties arising from the desirability of integrating the new material into existing fabrication processes.

For example, in recent years MOSFET gate electrodes have habitually been made of polycrystalline silicon (poly-Si). Various problems arise when high-k dielectric materials (or other non-SiO$_2$ dielectrics) are used as gate dielectric materials with poly-Si gates.

In particular, when using poly-Si on non-SiO$_2$ gate dielectric, carrier mobility in the MOSFET device can be low. Moreover, the threshold voltage, Vt, is different from that observed when SiO$_2$ dielectric is used with poly-Si gate electrodes: typically Vt is −0.3 V for poly-Si on SiO$_2$ whereas it is typically in the range −0.6 to −0.9 V for poly-Si on high-k gate dielectric. Furthermore, when poly-Si is used with high-k gate dielectric it is generally observed that the threshold voltage, Vt, for PMOS devices is too high, (because of Fermi-level pinning of the gate work function).

One approach that has been tried in view of the above-mentioned problems is to convert the poly-Si gate electrode material to silicide, for example NiSi or CoSi, thus forming a fully-silicided (or "FUSI") gate electrode. This can be considered to be a metal-like gate electrode. This approach has the advantage of avoiding the poly-depletion effect that is observed when using poly-Si gate electrodes, thus reducing the equivalent oxide thickness (EOT) at the gate. Certain proposals have used Hf-based materials (notably HfSiON, HfO$_2$ and HfO$_x$N$_y$) as a high-k gate dielectric material in association with FUSI gate electrodes.

However, when FUSI gate electrodes are used with high-k gate dielectric materials the following problem arises: there is insufficient PMOS/NMOS Vt modulation (asymmetric Vt and higher-than-target Vt values).

In view of the above problems, various researchers have concluded that it is preferable to use SiON rather than high-k dielectric materials when selecting a material for use as the gate dielectric for a CMOS device having a FUSI-gate. (SiON was already being considered as a replacement for SiO$_2$ gate dielectrics as an intermediate step on the way to changing to high-k dielectric materials, in view of the fact that a SiON film has a dielectric constant of about 4 to 8, depending upon the proportions of O and N therein.) However, it is generally found that the leakage current is undesirably high in devices using FUSI-gate electrodes on SiON gate dielectrics.

An alternative approach that has been tried in order to overcome the problems involved in using high-k gate dielectric with poly-Si gate electrodes is to modify the interface between the high-k gate dielectric and the poly-Si gate electrode, for example by adding barrier layers (or "capping layers") between the gate dielectric and the poly-Si gate electrode. However, this approach has not been particularly successful—even when a variety of different materials and deposition techniques were used to form the barrier layers on the high-k material, there was no reduction, or inadequate reduction, in the observed Vt shift when the gate stack structure was subsequently completed by a poly-Si gate electrode, and/or carrier mobility was degraded. In some cases the capping technique was unsuitable for making NMOS devices. Also, introduction of capping layers causes undesirable increase in the EOT.

The inadequacy of capping for tackling Vt shift can be seen from FIG. 1. In FIG. 1 there is a plot of gate length (expressed as Ldrawn) against Vt for a number of different PMOSFET structures all using poly-Si gate electrodes. These PMOSFET structures constitute comparative examples for use in demonstrating the improvements achieved using the present invention.

The first comparative example is a PMOSFET structure using a SiO$_2$ gate dielectric 2.5 nm thick; the results for this first comparative example are indicated using hollow squares in FIG. 1. The second comparative example is a PMOSFET structure using a HfO$_2$ gate dielectric 3 nm thick topped by a SiN$_x$ capping layer 1 nm thick; the results for this second comparative example are indicated using hollow triangles in FIG. 1. The third comparative example is a PMOSFET structure using a HfO$_2$ gate dielectric 2.5 nm thick topped by a HfSiO$_x$ capping layer 1 nm thick; the results for this third comparative example are indicated using hollow circles in FIG. 1.

As seen from FIG. 1, the Vt shift for HfO$_2$ or HfSiO$_x$ gate dielectric with polysilicon gates, relative to SiO$_2$ is unacceptably high. Further, the Vt difference is maintained for large and smaller gate lengths.

Poor results are seen for capped high-k dielectric materials used with poly-Si gate electrodes even when the high-k dielectric is capped with SiO$_2$.

The present inventor has postulated that the reason for the disappointing results that are observed in gate stacks using poly-Si gate electrodes and high-k dielectrics with caps is that the capping layers are formed on the gate dielectric layer before the poly-Si layer has been deposited. In other words, at the time when the capping layers are formed there is not yet an interface between the high-k dielectric material and the poly-Si.

The present invention provides a new method of fabricating MOS devices comprising FUSI gates, as defined in the appended claims.

The present invention further provides a MOS device comprising FUSI gates, as defined in the appended claims.

In the preferred embodiments of the present invention, a poly-Si layer is formed on a gate dielectric layer and then a layer of oxide is produced between the poly-Si and the gate dielectric, notably by a lateral re-oxidation process.

The formation of the thin oxide layer after the poly-Si has already been deposited on the gate dielectric releases Fermi-level pinning of the gate work function, enabling lower threshold voltages (Vt) to be obtained for smaller gates. As a result, a desired work function modulation can be achieved.

Because the lateral reoxidation process has been found to release Fermi-level pinning and reduce Vt shift it is believed that the thin layer of oxide formed by this process is generated by oxidation of the poly-Si.

Although the reoxidation process leads to an increase in the EOT at the gate, a CETinv (Capacitance equivalent thickness in inversion) reduction can be obtained by use of a FUSI gate—in other words, by converting the poly-Si layer into a fully-silicided form. Thus, the increase in EDT from a physically thicker dielectric is compensated by the absence of polysilicon depletion using a metal-like FUSI gate, so that overall there is little or no increase in CETinv under transistor operation conditions of inversion.

In certain of the preferred embodiments of the invention, the reoxidation process forms a particularly thin oxide layer between the gate electrode and gate dielectric, notably a layer having a thickness less than 10 angstroms (<1 nm).

In certain of the preferred embodiments of the invention, the gate dielectric is a high-k dielectric material, for example a Hf-containing material.

An advantage of fabricating MOS devices using FUSI gate electrodes on high-k gate dielectrics is that this enables further scaling of ULSI devices to be achieved whilst still using existing fabrication equipment. This avoids the need to introduce dual metal gate electrode devices, which could require significant changes in the machinery used in ULSI device fabrication processes.

The above and other features and advantages of the present invention will become apparent from the following description of a preferred embodiment thereof, given by way of example, and illustrated in the accompanying drawings, in which:

FIG. 2 illustrates schematically the main steps of a method for forming a CMOS device according to one preferred embodiment of the present invention, in which

FIG. 3 illustrates formation of a $SiO_2$ barrier layer in a MOS device gate stack structure according to a CMOS device fabrication technique of a first preferred embodiment of the present invention, in which:

FIG. 4 is a graph illustrating how Vt changes as gate lengths are scaled down in various PMOSFET structures fabricated using a reoxidation method according to the preferred embodiment of the invention, in which:

The preferred embodiment of the present invention will now be described with reference to FIGS. 2 to 4. In this description, it will be assumed that the method according to the preferred embodiment is being used to fabricate the gate stack structure of a MOSFET device. However, it is to be understood that the present invention is not limited to use in the fabrication of MOSFET devices.

Figure 2A:
FIGS. 2A to 2E illustrate respective different steps in the method.

As shown in FIG. 2A, a layer of gate dielectric 10 is formed on a substrate 1 (not shown in FIG. 2, but see FIG. 3). The substrate 1 will typically be silicon and may have an overlying layer 5 of $SiO_2$ or the like (also not shown in FIG. 2) for example to enhance mobility in or to enable the deposition of the gate dielectric 10. In the preferred embodiment of the invention this gate dielectric 10 is formed of a high-k dielectric material, notably a Hf-containing material, e.g. $HfO_2$. Any convenient process can be used for forming the gate dielectric layer 10, including, but not limited to: atomic-level chemical vapor deposition (ALCVD), metal organic chemical vapor deposition (MOCVD), etc, with any appropriate post-processing, e.g. post-deposition annealing. However, if the post-processing treatment results in a reduction in the ability of oxygen to diffuse through the high-k dielectric material forming layer 10 then the reoxidation conditions have to be adjusted in order to compensate. Typically, the gate dielectric layer 10 will have a thickness of 1 nm to 10 nm depending on the dielectric constant.

If desired, a capping layer (not shown) can be formed on the gate dielectric 10 before the subsequent processing. This will be appropriate, notably, when the high-k material forming the gate dielectric layer 10 acts as a barrier to penetration of oxygen (e.g. because of a post-deposition treatment such as plasma nitridation). According to the present invention it is desirable that the top few angstroms of the gate dielectric allow oxygen to pass therethrough (so as to oxidize the bottom few angstroms of the polysilicon gate and form the thin 'special' layer that releases the Fermi level pinning, as explained further below). Thus, in a case where there is poor oxygen diffusion through the high-k material forming the gate dielectric layer 10 it can be advantageous to deposit a cap layer formed of a small amount of $HfO_2$, or another excellent oxygen conductor (this will help achieve reoxidation at a lower temperature or more rapidly).

A poly-Si layer 20 is formed by any convenient process, for example: chemical vapor deposition (CVD), plasma-assisted CVD, sputtering, etc., on the gate dielectric 10 (or on its capping layer, if applicable). At this stage, the poly-Si layer 20 will typically have a thickness of 10 nm to 200 nm. The technique used for depositing the poly-Si layer is not critical to the success of the invention. However, from a practical viewpoint, it is preferred to use a deposition technique that results in formation of a layer of fine-grained or columnar crystalline poly-Si (so as to oxidize rapidly during the lateral reoxidation step discussed below).

Figure 2B:
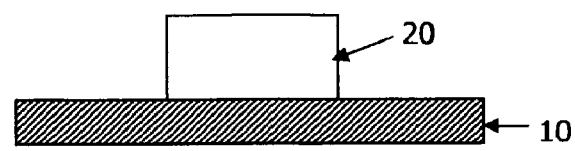

The poly-Si layer 20 is patterned in accordance with the desired dimensions of the gate electrode, to produce a structure as illustrated schematically in FIG. 2B. Typically, after patterning, the poly-Si layer will have a length in the range 25 to 100 nm depending on the technology node.

Any convenient process can be used for patterning the poly-Si layer 20, for example, in some cases a standard dry etch process can be used. If the gate dielectric layer 10 is formed of a high-k material then the standard dry etch process can be modified in a known manner so as to ensure removal of the high-k dielectric from areas exposed during etching of the gate electrode, without creation of a recess in the underlying Si substrate.

Figure 2C:
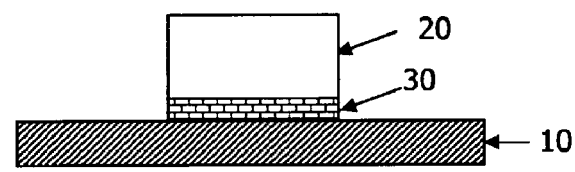

After the gate electrode patterning has been performed, a controlled lateral oxidation process is performed in order to produce a barrier layer 30 of silicon dioxide ($SiO_2$) at the interface between the poly-Si material 20 and the gate dielectric 10, as shown in FIG. 2C. The thickness of the oxide layer 30 is determined by the process conditions that are applied during the oxidation process.

Figure 3A:
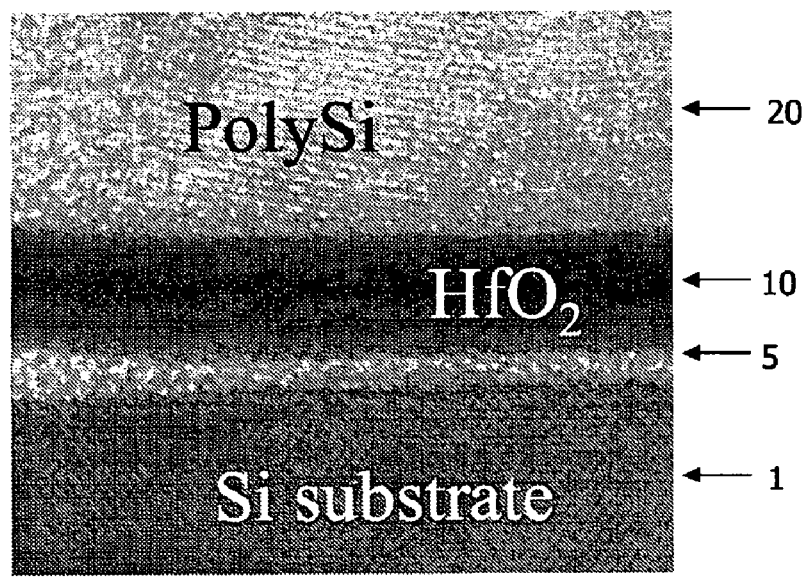
FIG. 3A shows the gate stack structure in an initial stage.
Figure 3B:
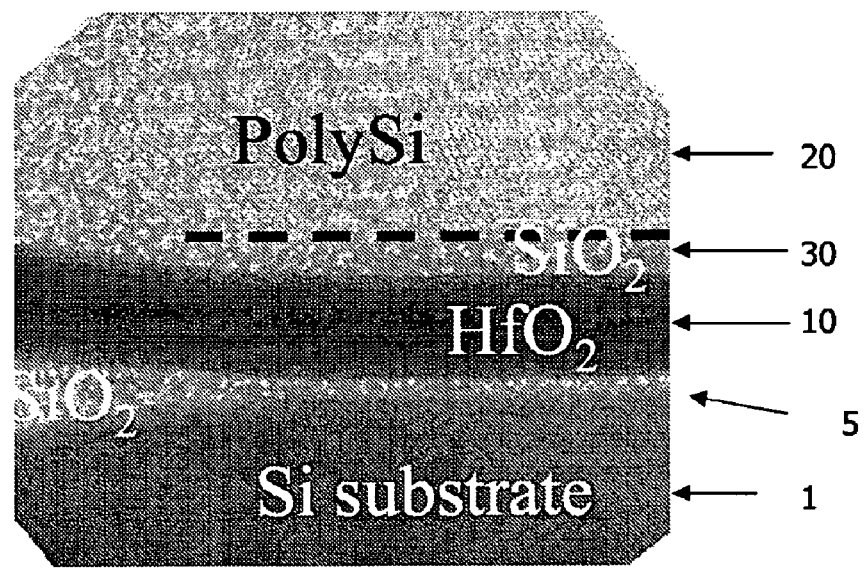
FIG. 3B shows the gate stack structure at a subsequent stage.

A lateral reoxidation process can successfully produce a thin $SiO_2$ layer 30 between the $HfO_2$ gate dielectric 10 and the poly-Si layer 20. This is illustrated in FIG. 3, which shows images produced using a transmission electron microscope (TEM). The images of FIG. 3 were produced from a wafer that was processed, after polysilicon patterning, in a conventional high temperature 700-900° C. thermal oxidation step. FIG. 3A shows the interface between the $HfO_2$ gate dielectric layer 10 and the poly-Si layer 20 before the lateral reoxidation process is performed. FIG. 3B shows the interface after completion of the lateral reoxidation process. The barrier oxide layer 30 is labelled in FIG. 3B.

In the example illustrated by FIG. 3, the barrier layer 30 has a thickness of 0.8 nm (8 Angstroms). This is greater than the desired thickness but serves to demonstrate that the lateral reoxidation process is effective to produce a layer of $SiO_2$ between the high-k dielectric layer 10 and the overlying poly-Si layer 20.

To produce a $SiO_2$ layer of a sufficiently low thickness for practical application, grown by lateral oxidation, between the polysilicon and the high-k layers, it is advisable to use a low temperature 500-700° C. oxidation in a batch-wafer furnace or a 600-800° C. rapid thermal oxidation in a single wafer tool. Since it is difficult to estimate the thickness of laterally-grown $SiO_2$ on device wafers, the oxidation condition is verified on bare Si monitor wafers that are oxidized using the same conditions as the device wafers. The thickness of the laterally-grown $SiO_2$ will be much lesser than that grown on a bare $SiO_2$ wafer.

Further, the oxidation condition will depend on the gate dielectric material, particularly the oxygen diffusion properties of the material. Rapid lateral diffusion of oxygen through the dielectric layer will allow a shorter time and/or lower temperature oxidation sequence. $HfO_2$ allows fast diffusion of the oxygen laterally, while Hf-silicate allows slower diffusion. HfSiON will likely allow very slow oxygen diffusion, thereby requiring stronger (higher temperature or longer time) oxidation conditions. An oxidation condition that produces a target $SiO_2$ layer of 1-2 nm on a bare silicon wafer is optimal for growing a thin $SiO_2$ layer between the gate dielectric layer 10 and the poly-Si layer 20 by lateral oxidation.

According to the preferred embodiment of the present invention, the thickness of the oxide barrier layer 30 should be related to the gate length. The extent of lateral oxidation across a patterned poly-Si line has a strong dependence on the oxidation temperature, partial pressure, time of oxidation, the permeability of oxygen through the dielectric, and a weak dependence on the oxidation rate of the polysilicon grain. The relationship is mathematically complex, but it has been found that the oxidation thickness saturates at a value determined by the diffusion limitation.

More particularly, it has been found to be advantageous to set the thickness of the oxide layer 30 to less than 10 angstroms (1 nm), for example to a value of 6 angstroms.

In principle, a minimum $SiO_2$ layer that is 1 monolayer or ~0.3 nm thick will be sufficient to release the Fermi-level pinning and bring the Vt values for poly-Si on non-$SiO_2$ dielectric close to that of poly-Si on $SiO_2$. However, in practice, it may be difficult to ensure the uniform growth of a 0.3 nm layer of $SiO_2$ by lateral reoxidation. As a practical matter, it is simple to set the oxidation conditions with the aim of producing a 0.5 nm+/−0.1 nm $SiO_2$ layer. A $SiO_2$ layer of this thickness gives the benefit of Vt-shift reduction while only causing a limited increase in the EOT. This increase in EOT can be compensated by converting the poly-Si layer 20 to a fully-silicided form, making it possible to take advantage of the poly depletion gain (~0.4 nm) obtained from use of the metal-like FUSI gate. With this choice of thickness and process conditions, the benefit of Vt reduction, or Vt matching with $SiO_2$ and poly depletion, can be achieved.

The subsequent steps in the method according to the preferred embodiment of the present invention (illustrated in FIGS. 2D to 2F) relate to the conversion of the poly-Si layer 20 to a fully-silicided form so as to constitute a FUSI gate electrode. However, before continuing with the description of these subsequent steps in the preferred method, it is useful to consider the properties of MOS devices based on the gate stack structure of FIG. 2C, that is, devices having poly-Si gate electrodes.

The present inventor has found that the devices fabricated using the method according to the preferred embodiment of the invention have a reduced Vt shift as the gate length is scaled down. This improvement in device performance is due to the thin barrier layer of oxide 30 that is produced by the above-described lateral reoxidation process.

The improved Vt shift can be seen from a consideration of FIG. 4. FIG. 4 relates to devices having the barrier oxide layer 30 produced by reoxidation (as described above), but poly-Si gate electrodes.

Figure 4A:
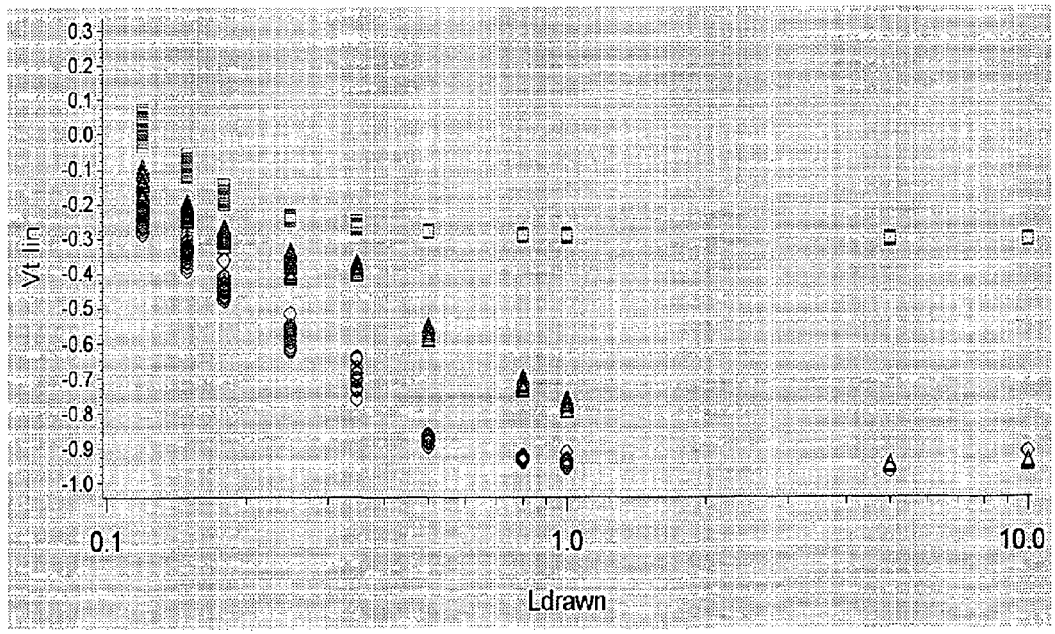
FIG. 4A shows results obtained for a first group of PMOSFET structures based on the first group of comparative examples.

In FIG. 4A there is a plot of gate length against Vt for a first group of PMOSFET structures fabricated using the method according to the above-described preferred embodiment as described so far, as well as for the first comparative example that uses a 2.5 nm $SiO_2$ gate dielectric with a poly-Si gate electrode. This first group of PMOSFET structures according to the invention is based on the first group of comparative examples discussed above.

The first example according to the invention is a PMOSFET structure based on the above-described second comparative example; it uses a $HfO_2$ gate dielectric 3 nm thick (without a $SiN_x$ capping layer) and, between the poly-Si gate electrode and the gate dielectric layer, there is an $SiO_2$ barrier layer formed by lateral oxidation under process conditions in a batch furnace so as to give a 2 nm thick $SiO_2$ layer on a bare wafer at 700° C. The exact thickness of this layer on the device wafer is seen by XTEM later. The results for this first example are indicated using hollow circles in FIG. 4A.

The second example according to the invention is a PMOSFET structure based on the above-described third comparative example; it uses a $HfO_2$ gate dielectric 2.5 nm thick topped by a $HfSiO_x$ capping layer 1 nm thick and, between the poly-Si gate electrode and the gate dielectric layer, there is an $SiO_2$ barrier layer formed by lateral oxidation under process conditions in a batch furnace so as to give a 2 nm thick barrier layer 30 at 700° C. The results for this second example are indicated using hollow triangles in FIG. 4A.

Figure 1:
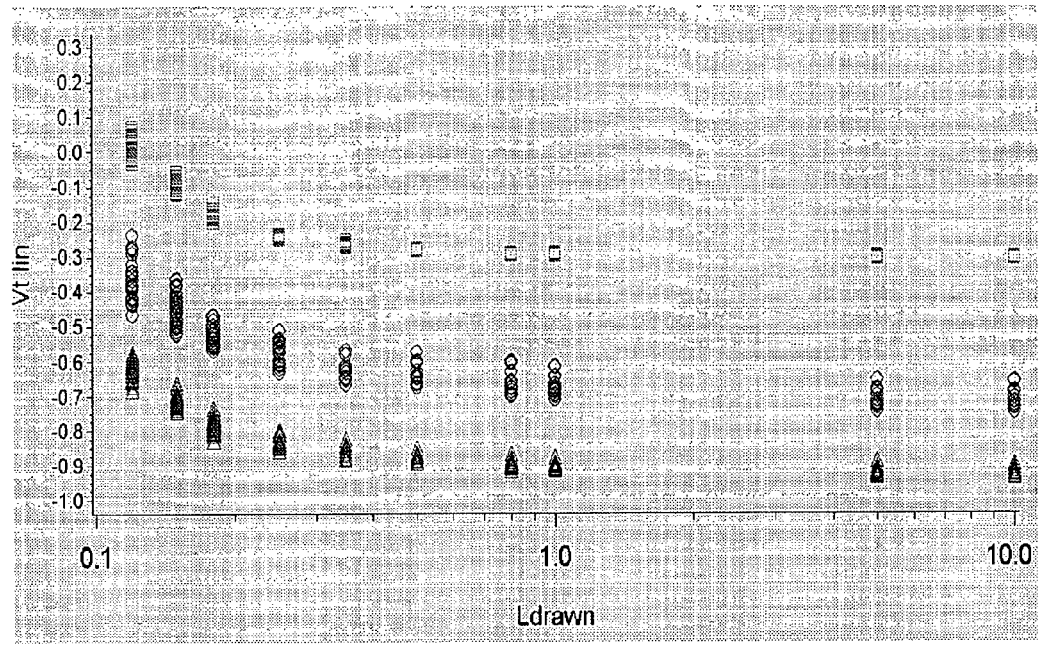
FIG. 1 is a graph illustrating how Vt changes as gate lengths are scaled down in various comparative examples that are PMOSFET structures which do not make use of the present invention.

A comparison of the results shown in FIG. 1 for the $2^{nd}$ Comparative Example (triangles) with the results shown in FIG. 4A for the $1^{st}$ Example (circles), shows that the lateral-oxidation-grown layer $SiO_2$ between the $HfO_2$ gate dielectric and the poly-Si gate electrode results in a reduction in the Vt-shift observed when using this high-k dielectric material. The reduction in Vt-shift is particularly apparent at shorter gate lengths.

A comparison of the results shown in FIG. 1 for the $3^{rd}$ Comparative Example (circles) with the results shown in FIG. 4A for the $2^{nd}$ Example (triangles), shows that, once again, the lateral-oxidation-grown $SiO_2$ between the $HfSiO_x$-capped $HfO_2$ gate dielectric and the poly-Si gate electrode results in a reduction in the Vt-shift observed when using this high-k dielectric material, especially at shorter gate lengths.

FIG. 4A demonstrates the concept that the Vt reduction by lateral oxidation is in fact realizable for the case where a furnace batch-wafer oxidation step was used. However, the thickness of the lateral-reoxidation-grown layer 30 in these examples is likely to be greater than necessary. Accordingly, the experiment was repeated using a rapid thermal oxidation single-wafer tool, which used a shorter time and lower temperature, enabling a thinner $SiO_2$ layer to be realized. Monitor wafer data showed that, in the repeated experiment, the EOT increase was <0.8 nm. This experiment showed that the effect of Vt reduction by lateral oxidation can be achieved using a thinner layer of $SiO_2$ also, with 1 monolayer being the theoretical limit.

Figure 4B:
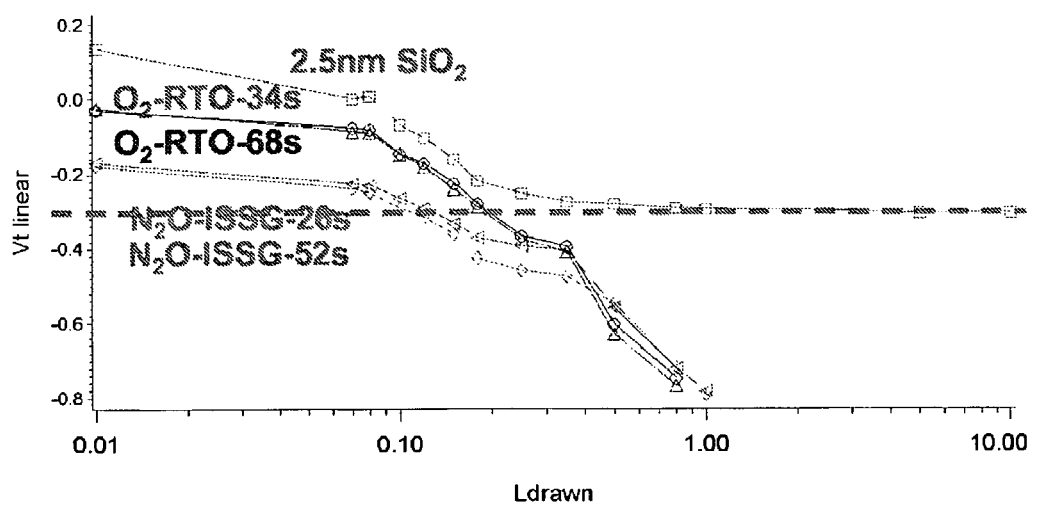
FIG. 4B shows results obtained for a second group of PMOSFET structures.

In FIG. 4B there is a plot of gate length against Vt for a second group of PMOSFET structures fabricated using the reoxidation method employed in the above-described preferred embodiment, as well as for the first comparative example. This second group of PMOSFET structures all use a gate dielectric layer which is formed of a $HfO_2$ layer 2.5 nm thick topped by a 1 nm HfSiO capping layer, and all use poly-Si gate electrodes.

The third example is a PMOSFET structure having, between the HfSiO dielectric-capping layer and the poly-Si gate electrode, a laterally-grown $SiO_2$ layer (grown under rapid thermal oxidation conditions at 800° C. and 1 Torr for 34 seconds—conditions which grow a 1 nm oxide layer on a bare Si wafer). The results for this third example are indicated using hollow upright triangles in FIG. 4B.

The fourth example is a PMOSFET structure having, between the HfSiO dielectric-capping layer and the poly-Si gate electrode, a laterally-grown $SiO_2$ layer (grown under rapid thermal oxidation conditions at 800° C. and 1 Torr for 68 seconds—conditions which grow a <2 nm thick oxide layer on a bare Si wafer). The results for this fourth example are indicated using hollow circles in FIG. 4B (that is, triangles whose lower side is horizontal in the figure).

The fifth example is a PMOSFET structure having, between the HfSiO dielectric-capping layer and the poly-Si gate electrode, an oxide layer 30 formed by in-situ steam generation (ISSG) in a cold wall rapid thermal processing chamber, with the wafer held at 800° C. for 26 seconds in $N_2O$ at 12.5 Torr pressure (targeted to grow 1 nm nominally on a bare Si wafer). The results for this fifth example are indicated using hollow sideways triangles in FIG. 4B (that is, triangles whose lower side is inclined to the horizontal).

The sixth example according to the invention is a PMOSFET structure having, between the HfSiO dielectric-capping layer and the poly-Si gate electrode, an oxide layer 30 formed by ISSG in a cold wall rapid thermal processing chamber, with the wafer held at 800° C. for 52 seconds in $N_2O$ at 12.5 Torr. The results for this sixth example are indicated using hollow diamonds in FIG. 4B.

FIG. 4B shows that even shorter oxidation sequences that occur with rapid thermal oxidation conditions are effective to achieve lateral oxidation resulting in Vt shift reduction.

The above results demonstrate that the formation of a thin oxide barrier layer between the high-k dielectric and the poly-Si electrode is effective to release Fermi-level pinning and provide an acceptable work function modulation. Moreover, poly depletion is improved. However, even when the thickness of the oxide barrier layer is minimized the creation of this oxide barrier layer leads to an increase of around 0.4 nm in the EOT at the gate. Accordingly, it is desirable to adopt some measure to counteract this increase in EOT.

It is known that devices using FUSI gates on high-k dielectrics or SiON have a significantly lower CETinv than comparable devices using poly-Si gates. In particular, a reduction in CETinv of around 0.3 nm can be seen in devices having FUSI gate electrodes compared to devices having poly-Si gate electrodes.

According to the preferred embodiments of the present invention, after the oxide barrier layer 30 has been formed, the poly-Si layer 20 is converted to a fully-silicided form to produce a FUSI-gate electrode, thereby reducing the EOT of the device.

Figure 2D:
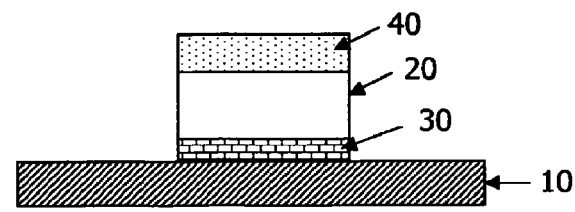

Returning to FIG. 2, the process for converting the poly-Si layer 20 to a FUSI gate electrode layer will now be described. After the barrier oxide layer 30 has been formed, a metal layer 40, typically nickel (Ni) or cobalt (Co), is deposited on the poly-Si layer 20, as indicated in FIG. 2D. Typically, the nickel layer is deposited by sputtering. It is deposited all over the wafer including the poly-Si and the surrounding active source/drain regions. Normally a spacer will be between the gate and the source/drain areas (so that silicidation occurs at the gate and the source and drain regions but not over the spacer, thus preventing a conductive path between the gate and source-drain regions).

Figure 2E:
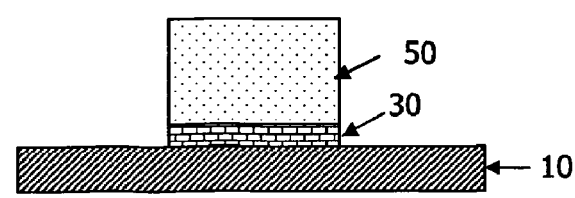

The resulting gate stack structure is sintered typically at temperatures between 300-500° C. whereby the metal species diffuses into the poly-Si, reacting with it fully (down to the interface with the barrier oxide 30). This produces a fully-silicided layer 50, as indicated in FIG. 2E, whereby to produce the finished gate stack structure (ready for connection of contacts).

The layer 50 can have any desired thickness compatible with the poly-Si process. The thickness of the metallic layer 40 (e.g. Ni) is adjusted in dependence on the thickness of the poly-Si layer 20 so as to give full silicidation of the polysilicon. The techniques and conditions necessary to produce FUSI gate electrodes are well-known to the skilled person and so no further details will be given here.

It has been found that the method according to the preferred embodiment of the present invention can produce MOS devices that have FUSI gate electrodes and high-k gate dielectric with adequate work function modulation. This makes it feasible to use devices having FUSI electrodes at the 65 nm and 45 nm technology nodes. Thus, it will still be possible to use conventional fabrication equipment even when ULSI device features are scaled down to 45/65 nm. More particularly, known processes and equipment can be used to implement the various steps of the present invention, with only minor adaptations being required in processing conditions for reoxidation or silicidation steps (whereby to ensure compatibility of these processes with the gate dielectric material and whereby to form a thin lateral-oxidation-grown $SiO_2$ layer).

Although the present invention has been described above with reference to a particular preferred embodiment, it is to be understood that the invention is not limited by reference to the specific details of this preferred embodiment. More specifically, the person skilled in the art will readily appreciate that, modifications and developments can be made in the preferred embodiment without departing from the scope of the invention as defined in the accompanying claims.

For example, in the above-described preferred embodiment a thin oxide layer is grown between a poly-Si layer formed on a high-k dielectric, notably a Hf-containing high-k dielectric. However, the present invention can be applied to grow an oxide layer between a poly-Si layer formed on other high-k dielectric materials, and on other non-$SiO_2$ dielectric materials, such as a SiON gate dielectric layer.

Furthermore, in the above-described preferred embodiment of the invention, the poly-Si layer was patterned to form the desired shape of the gate electrode before the lateral reoxidation step was performed. However, alternative approaches are possible. For example, a super-thin layer of poly-Si may be deposited over the dielectric layer 10 on the wafer, then fully oxidized, and then thinned down to an allowable thickness by etching.

Moreover, although the present invention has been described above in terms of embodiments relating to the fabrication of a gate stack structure for a MOSFET device, the present invention is applicable to the fabrication of other devices, notably devices where threshold voltage control is important but is harder to achieve when the dielectric is changed from $SiO_2$ to a non-$SiO_2$ dielectric (e.g. a high-k dielectric).

The invention claimed is:

1. A method of fabricating a MOS device, comprising:
   forming a layer of non-$SiO_2$ gate dielectric material on a substrate; and
   forming a layer of polycrystalline silicon on said non-$SiO_2$ gate dielectric layer;
   forming a layer of oxide between said polycrystalline silicon layer and said non-$SiO_2$ gate dielectric layer after said layer of polycrystalline silicon has been formed on said layer of non-$SiO_2$ gate dielectric material; and
   converting said polycrystalline silicon to a fully-silicided form.

2. The MOS device fabrication method of claim 1, wherein said oxide-layer has a thickness of less than 1 nm.

3. The MOS device fabrication method of claim 1, wherein said non-$SiO_2$ gate dielectric material is a high-k dielectric material.

4. The MOS device fabrication method of claim 3, wherein said non-$SiO_2$ gate dielectric material is a Hf-containing material.

5. The MOS device fabrication method of claim 1, wherein said non-$SiO_2$ gate dielectric material is SiON.

6. A method of claim 1, further comprising forming a non-$SiO_2$ gate dielectric and a FUSI gate electrode, with said layer of oxide situated between the gate electrode and the non-$SiO_2$ gate dielectric.

7. The method according to claim 6, wherein the oxide layer between the gate electrode and the gate dielectric is less than 1 nm thick.

8. A method according to claim 6, wherein the gate dielectric comprises a layer of high-k dielectric material.

9. A method according to claim 6, wherein the gate dielectric comprises a layer of SiON.

10. The method according to claim 2, wherein said gate dielectric material is a high-k dielectric material.

11. The method according to claim 2, wherein said gate dielectric material is SiON.

12. The method according to claim 4, further comprising forming a non-$SiO_2$ gate dielectric and a FUSI gate electrode, with said layer of oxide between the FUSI gate electrode and the non-$SiO_2$ gate dielectric.

13. The method according to claim 7, wherein the non-$SiO_2$ gate dielectric comprises a layer of high-k dielectric material.

14. The method according to claim 1, wherein said forming said layer of oxide includes lateral oxidation.

15. The method according to claim 1, wherein said forming said layer of oxide includes oxidizing said polycrystalline silicon.

16. The method according to claim 3, wherein said forming said layer of oxide includes oxidizing said polycrystalline silicon.

17. The method according to claim 4, wherein said forming said layer of oxide includes oxidizing said polycrystalline silicon.

18. The method according to claim 5, wherein said forming said layer of oxide includes oxidizing said polycrystalline silicon.

19. The method according to claim 6, wherein said forming said layer of oxide includes oxidizing said polycrystalline silicon.

20. The method according to claim 2, wherein said forming said layer of oxide includes oxidizing said polycrystalline silicon.

* * * * *